United States Patent
Su et al.

(10) Patent No.: US 11,621,149 B2
(45) Date of Patent: Apr. 4, 2023

(54) CORROSION-RESISTANT GAS DELIVERY ASSEMBLY, AND PLASMA PROCESSING APPARATUS

(71) Applicant: ADVANCED MICRO-FABRICATION EQUIPMENT INC. CHINA, Shanghai (CN)

(72) Inventors: Yilong Su, Shanghai (CN); Rason Zuo, Shanghai (CN); Miaojuan Chen, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 211 days.

(21) Appl. No.: 17/079,402

(22) Filed: Oct. 23, 2020

(65) Prior Publication Data

US 2021/0151294 A1 May 20, 2021

(30) Foreign Application Priority Data

Oct. 24, 2019 (CN) .......................... 201911018284.6

(51) Int. Cl.
*H01J 37/32* (2006.01)
(52) U.S. Cl.
CPC ..... *H01J 37/3244* (2013.01); *H01J 37/32119* (2013.01)
(58) Field of Classification Search
CPC ............. H01J 37/3244; H01J 37/32119; H01J 37/32477; H01J 37/32642; H01J 37/32724
See application file for complete search history.

(56) References Cited

U.S. PATENT DOCUMENTS

| 5,961,776 A | * | 10/1999 | Sato .................. H01J 37/32192 |
| | | | 204/298.38 |
| 7,846,291 B2 | | 12/2010 | Otsuki |
| 8,133,349 B1 | | 3/2012 | Panagopoulos |
| | | | (Continued) |

FOREIGN PATENT DOCUMENTS

| JP | 2007291528 A | 11/2007 |
| KR | 20090085049 A | 8/2009 |
| | (Continued) | |

*Primary Examiner* — Tung X Le
(74) *Attorney, Agent, or Firm* — Womble Bond Dickinson (US) LLP; Joseph Bach, Esq.

(57) ABSTRACT

Disclosed are a corrosion-resistant gas delivery assembly and a plasma processing apparatus. An inlet gas delivery component and a gas diffusion component are combined correspondingly with an inlet gas accommodation hole and a diffusion accommodation space that are arranged in a liner body, to form a multi-component structural configuration, which avoids direct contact of the process gas with the liner body due to liner body surface defects caused by high temperature. The advantages as offered include: effectively preventing the process gas from corroding a gas delivery assembly and the plasma processing apparatus, and solving the problems such as metal contamination and solid particle contamination in the reaction chamber caused by the corrosive fraction in the process gas; besides, the multi-component structural configuration facilitates routine maintenance.

15 Claims, 4 Drawing Sheets

(56) References Cited

U.S. PATENT DOCUMENTS

| | | | |
|---|---|---|---|
| 8,828,182 B2 | 9/2014 | Detmar et al. | |
| 8,852,685 B2 | 10/2014 | Kenworthy et al. | |
| 9,051,647 B2* | 6/2015 | Cooperberg | H01L 21/31116 |
| 10,347,470 B2 | 7/2019 | Lv et al. | |
| 10,930,526 B2* | 2/2021 | Sun | H01J 37/32495 |
| 2006/0196419 A1 | 9/2006 | Tudhope et al. | |
| 2010/0028572 A1 | 2/2010 | Kobayashi et al. | |
| 2019/0019654 A1* | 1/2019 | Kobayashi | H01J 37/32724 |
| 2020/0118787 A1* | 4/2020 | Ikegami | H01J 37/21 |

FOREIGN PATENT DOCUMENTS

| | | |
|---|---|---|
| KR | 20120139741 A | 12/2012 |
| KR | 20130138252 A | 12/2013 |
| KR | 20160103126 A | 8/2016 |
| TW | 201209910 A | 3/2012 |
| TW | 201830447 A | 8/2018 |

* cited by examiner

CORROSION-RESISTANT GAS DELIVERY ASSEMBLY, AND PLASMA PROCESSING APPARATUS

RELATED APPLICATION

The present application claims priority to and the benefit of Chinese Patent Application No. CN 201911018284.6 filed on Oct. 24, 2019 and the disclosure of which is hereby incorporation by reference in its entirety.

FIELD

Embodiments of the present disclosure generally relate to semiconductor devices, and particularly relate to a corrosion-resistant gas delivery assembly and a plasma processing apparatus.

BACKGROUND

A gas delivery assembly is crucial to a typical plasma processing apparatus, via which a process gas outputted from a gas box is supplied into a reaction chamber where the process gas is ionized into plasma available for processing a wafer disposed in the reaction chamber.

A gas delivery channel in the gas delivery assembly usually includes a plurality of feed holes directly created in an aluminum alloy liner. Upon delivery of a process gas, the process gas first rushes into the gas delivery channel to form a hermetic and high-pressure gas cavity therein. As a process gas with a low saturated vapor pressure is easily accumulated and condensed in the gas delivery channel, a heating slot is typically provided in the plasma processing apparatus to heat the process gas in the liner so as to prevent condensation of the process gas in the gas delivery channel and inside the chamber. The heating increases the saturated vapor pressure of the process gas and thus prevents condensation.

Additionally, in order to prevent a corrosive fraction of the process gas from corroding the liner and bringing about issues such as metal contamination and solid particle contamination, the interior surface of the gas delivery channel generally undergoes hard anodization or high-density anodization. Generally, the anodized layer is made of aluminum oxide, the linear expansion coefficient of which differs, to a relatively large extent, from that of the base material (aluminum alloy) of the liner. Due to such mismatch in their linear expansion coefficients, a substantial amount of microcracks likely occur to the anodized layer on the surface of the gas delivery channel in the course of heating the liner, a potential consequence of which is that the corrosive gas directly contacts with the aluminum alloy via these microcracks, not only causing corrosion to the liner, but also bringing about issues such as metal contamination and particle contamination. With increase of shrinkages and cracks due to gas corrosion in long-term service, parameter drifts of the process gas potentially occur. To solve such problems, a usual practice is to change the anodizing process for the inside of the gas delivery channel or spray a film of another material to seal the microcracks. However, such practice is difficult to operate; besides, it is high in cost and demanding on quality control. Therefore, an economic and convenient method is needed to solve the above problems.

SUMMARY OF THE INVENTION

Embodiments of the present disclosure provide a corrosion-resistant gas delivery assembly and a plasma processing apparatus. An inlet gas delivery component and a gas diffusion component are combined correspondingly with an inlet gas accommodation hole and a diffusion accommodation space that are arranged in a liner body, to form a multi-component structural configuration, which avoids direct contact of the process gas with the liner body due to liner body surface defects caused by high temperature, effectively prevents the process gas from corroding a gas delivery assembly and the plasma processing apparatus, and solves the problems such as metal contamination and solid particle contamination in the reaction chamber caused by the corrosive fraction in the process gas.

The present disclosure is implemented through the following technical solution:

A corrosion-resistant gas delivery assembly in a plasma processing apparatus comprises:

a liner body;

a diffusion accommodation space circumferentially disposed in the liner body; and a gas diffusion component disposed in the diffusion accommodation space, wherein a material of the gas diffusion component is corrosion resistant, a gas diffusion channel is circumferentially provided in the gas diffusion component, and a plurality of outlet gas channels are further provided in an inner wall of the gas diffusion component, the outlet gas channels communicating with the gas diffusion channel.

Optionally, the diffusion accommodation space is a recessed groove, and a plurality of gas outlet holes are provided in an internal sidewall of the liner body, the gas outlet holes communicating with the outlet gas channels.

Optionally, the diffusion accommodation space has a staged shape.

Optionally, the gas diffusion channel is an open top gas diffusion channel or an enclosed gas channel.

Optionally, an outer wall of the liner body is further provided with at least one inlet gas accommodation hole, the at least one inlet gas accommodation hole communicating with the diffusion accommodation space;

an inlet gas delivery component is provided in each of the at least one inlet gas accommodation hole, wherein a material of the inlet gas delivery component is corrosion resistant; an inlet channel is provided in the inlet gas delivery component, one end of the inlet gas channel communicating with a gas tubing of a gas delivery assembly, and the other end thereof communicating with the gas diffusion channel.

Optionally, a material of the liner body includes: aluminum alloy; and a material of the inlet gas delivery component includes: ceramics or stainless steel; and a material of the gas diffusion component includes: ceramics.

Optionally, a corrosion-resistant material coating is respectively provided for the diffusion accommodation space and a surface of the gas inlet accommodation hole;

Optionally, a corrosion-resistant material coating is respectively provided for the inlet gas channel and/or the diffusion channel and/or the outlet gas channels.

Optionally, a corrosion-resistant material coating is respectively provided for the inner wall of each of the gas outlet holes and for the surface of the gas diffusion component in contact with the internal side of the diffusion accommodation space.

Optionally, the corrosion-resistant material coating refers to a Teflon coating or a yttrium oxide film or an anodized layer.

Optionally, a plurality of sealing structures are provided among the liner body, the gas diffusion component, and the inlet gas delivery component; a plurality of seals are respectively disposed in the sealing structures; the sealing structures are disposed at the intersection between the liner body and the gas diffusion component, and/or at the intersection between the gas diffusion component and the inlet gas delivery component, and/or at the intersection between the inlet gas delivery component and the liner body.

Optionally, the gas outlet holes have a conical shape or a straight shape which has consistent diameters at two ends.

Optionally, one or more laps of the gas diffusion channel are provided;

in the case that more laps of the gas diffusion channel are provided, the respective laps of the gas diffusion channel communicate with each other.

Embodiments of the present disclosure further provide a plasma processing apparatus including a corrosion-resistant gas delivery assembly, the apparatus comprising:

a reaction chamber;

a corrosion-resistant gas delivery assembly circumferentially provided on a chamber body sidewall of the reaction chamber; and a dielectric window disposed on the liner body.

Optionally, the plasma processing apparatus further comprises:

an inductively coupled coil disposed on the dielectric window, wherein the inductively coupled coil is loaded with a radio-frequency power, the radio-frequency power being coupled into the reaction chamber via the dielectric window; and the process gas fed into in the reaction chamber via a gas delivery assembly is ionized into plasma, the plasma being configured to process a wafer disposed at the bottom of the reaction chamber.

The present disclosure offers the following advantages:

(1) the present disclosure provides a corrosion-resistant gas delivery assembly and a plasma processing apparatus, wherein the diffusion accommodation space is configured to accommodate a gas diffusion component and a gas diffusion channel is provided in the gas diffusion component; as such, a reactive gas can only flow in the gas diffusion channel and cannot contact with the liner body; in this way, the process gas is effectively prevented from corroding the liner body; moreover, a material of the gas diffusion component is corrosion resistant, which solves the issues of in-chamber metal contamination and solid particle contamination caused by a corrosive fraction in the process gas;

(2) the present disclosure provides a corrosion-resistant gas delivery assembly and a plasma processing apparatus, wherein the gas diffusion channel and the inlet gas channel are provided respectively as a component independent of the liner body, such that only individual components are replaced when maintaining the gas delivery assembly, without replacing the whole liner body structure, which reduces waste of material resources and facilitates routine maintenance;

(3) the corrosion-resistant gas delivery assembly and a plasma processing apparatus according to the present disclosure prevent increase of shrinkages and cracks on the liner body caused by gas corrosion and meanwhile overcomes parameter drifts of the process gas;

(4) The corrosion-resistant gas delivery assembly and a plasma processing apparatus according to the present disclosure do not need a nozzle structure, thereby significantly simplifying the structure of the assembly and further rendering the whole structure of the apparatus simple.

BRIEF DESCRIPTION OF THE
ACCOMPANYING DRAWINGS

DETAILED DESCRIPTION OF THE
PREFERRED EMBODIMENTS

To make the technical solutions and advantages of the embodiments of the present disclosure much clearer, the technical solutions in the embodiments of the present disclosure will be described clearly and comprehensively with reference to the accompanying drawings; apparently, the embodiments as described are only part of the embodiments of the present disclosure, rather than all of them. All other embodiments obtained by those skilled in the art without exercise of inventive work based on the illustrative embodiments all fall within the protection scope of the present disclosure.

It is noted that the drawings are simplified and illustrated in a non-precision ratio, only intended for facilitating clear illustration of embodiments of the present disclosure.

Figure 1:
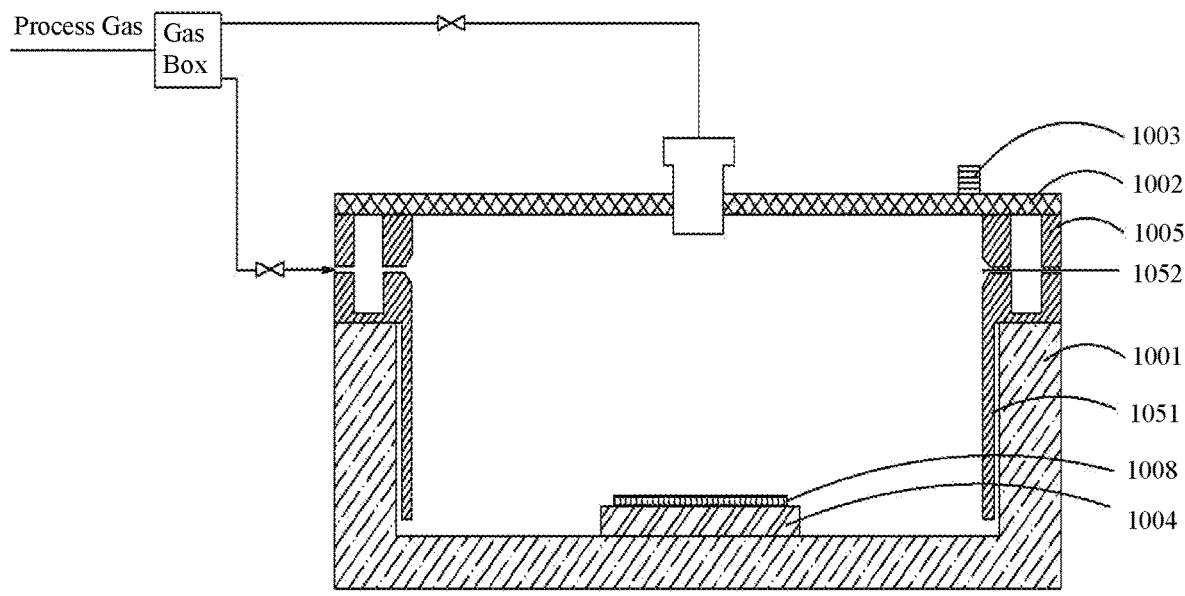
FIG. 1 is an inductively coupled plasma processing apparatus in Embodiment 1 of the present disclosure.

FIG. 1 shows a plasma processing apparatus according to the present disclosure. Referring to FIG. 1, the plasma processing apparatus comprises: a reaction chamber 1001, a gas delivery assembly, and a dielectric window 1002. The gas delivery assembly comprises a liner body 1005 provided with a transfer channel, the liner body 1005 being circumferentially provided on a chamber body sidewall of the reaction chamber 1001, the dielectric window 1002 being disposed on the liner body 1005.

Additionally, the plasma processing apparatus further comprises: an inductively coupled coil 1003 disposed on the dielectric window 1002, the inductively coupled coil 1003 being loaded with a radio-frequency power, the radio-frequency power being coupled in the reaction chamber 1001 via the dielectric window 1002, wherein the process gas introduced in the reaction chamber 1001 via the liner body 1005 is ionized to form plasma, the plasma being configured to process the wafer 1008 disposed on the base 1004 at the bottom of the reaction chamber 1001.

Embodiment I

In this embodiment, the plasma processing apparatus refers to an inductively coupled plasma processing apparatus (ICP apparatus).

FIG. 1 illustrates an inductively coupled plasma processing apparatus according to the current embodiment. The radio-frequency power loaded onto the inductively coupled coil 1003 is coupled into the reaction chamber 1001 via the dielectric window 1002 to form an electrical field region in the reaction chamber 1001, ionizing the process gas fed via a gas delivery assembly into the reaction chamber 1001 to form plasma or ions for performing etching and other processing with respect to the wafer 1008 on the base 1004 at the bottom of the reaction chamber 1001. A liner body 1005 is circumferentially provided on the chamber body sidewall of the reaction chamber 1001, the liner body 1005 being configured to bear the edge of the dielectric window 1002 disposed above. The liner body 1005 is grounded by contacting with the chamber body. A baffle plate 1051 surrounding the internal side of the chamber body of the reaction chamber 1001 extends downwardly from the inner wall of the liner body 1005; the baffle plate 1051 is configured to implement plasma confinement so as to protect the parts including the chamber body of the reaction chamber 1001 from being corroded; additionally, a heating slot is further provided in the liner body 1005, configured to heat the process gas.

In the gas delivery assembly, the process gas outputted via a gas box is first split by a splitter into two paths: middle inlet path and edge inlet path. The middle inlet path supplies gas to the reaction chamber 1001 via a gas intake mounted at the dielectric window 1002, while the process gas in the edge inlet path is delivered to the gas passage in the liner body 1005 via the gas tubing in the gas delivery assembly, and then supplied into the reaction chamber 1001 via a plurality of outlet holes 1052 provided in a distributed manner on the internal sidewall of the liner body 1005. Arrangement of the dual-inlet structure, which includes the middle inlet way and the edge inlet way, improves distribution homogeneity of the process gas in the reaction chamber 1001.

Figure 2:
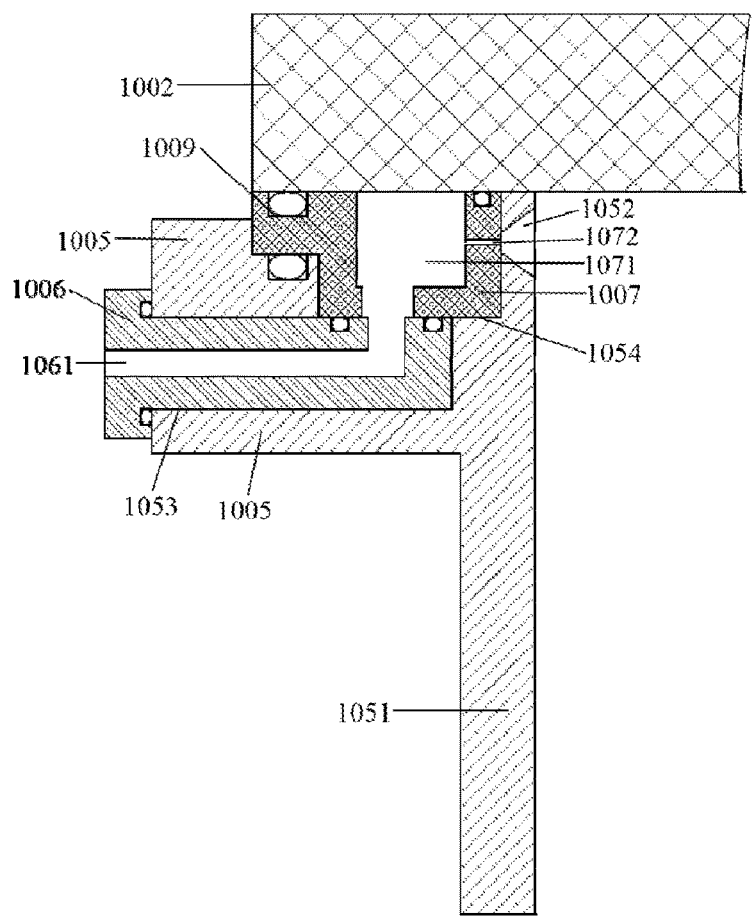
FIG. 2 is a structural schematic diagram of a gas delivery assembly in FIG. 1.

Hereinafter, detailed illustrations will be made to the edge inlet way: FIG. 2 shows a structural schematic diagram of a gas delivery assembly in the plasma processing apparatus according to the current embodiment. The structure of the gas passage in the liner body 1005 includes: a plurality of inlet gas accommodation holes 1053 provided in a distributed manner in the outer wall of the liner body 1005; a plurality of inlet gas delivery components 1006 are matched with the inlet gas accommodation holes 1053 and are respectively inlaid in the inlet gas accommodation holes 1053; an inlet gas channel 1061 is provided for each of the inlet gas delivery components 1006, the inlet gas channel 1061 communicating with the gas tubing in the gas delivery assembly.

Figure 3:
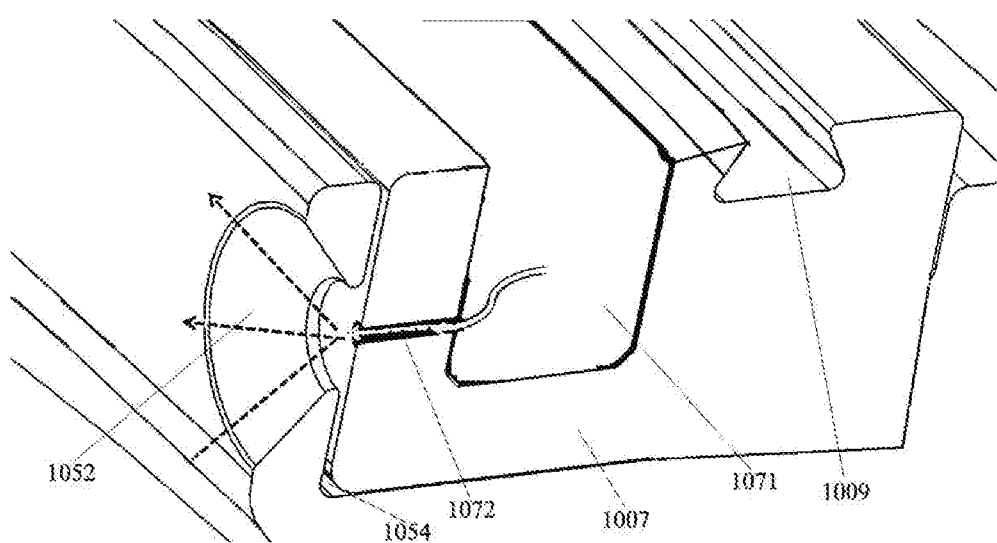
FIG. 3 is a cross-sectional stereoscopic structural schematic diagram of the gas diffusion component and the liner body portion in FIG. 2.

FIG. 3 is a cross-sectional stereoscopic structural schematic diagram of the gas diffusion component 1007 and the liner body 1005 in FIG. 2. As shown in FIG. 3 in conjunction with FIG. 2, an annular diffusion accommodation space 1054 communicating with the inlet gas accommodation holes 1053 is circumferentially provided in the liner body 1005 (as shown in FIG. 2). The diffusion accommodation space 1054 is a recessed groove; an annular gas diffusion component 1007 is matched with the diffusion accommodation space 1054 and is inlaid in the diffusion accommodation space 1054. At least one lap of gas diffusion channel 1071 is circumferentially provided in the gas diffusion component 1007. In the case that a plurality of laps of the gas diffusion channel 1071 are provided, the laps of gas diffusion channel 1071 communicate with each other. In this embodiment, one lap of gas diffusion channel 1071 is provided, the gas diffusion channel 1071 communicating with the inlet gas channel 1061, wherein the gas diffusion channel 1071 is an open top gas diffusion channel structure, the top of which contacts with the dielectric window 1002.

A plurality of outlet gas channels 1072 are provided in a distributed manner in the inner wall of the gas diffusion component 1007. The diameter of the outlet gas channels 1072 is equal to or less than 1 mm; one end of the respective outlet gas channel 1072 communicates with the gas diffusion channel 1071, while the other end thereof communicates with the gas outlet holes 1052 in the internal sidewall of the liner body 1005; the process gas is delivered from the gas tubing to the gas diffusion channel 1071 via the inlet gas channel 1061, and is then laterally delivered into the reaction chamber 1001 via the outlet gas channels 1072 and the gas outlet holes 1052.

In some embodiments, the liner body 1005 is made of aluminum alloy; a corrosion-resistant material coating is respectively provided for the inlet gas accommodation holes 1053 and the diffusion accommodation space 1054. In some embodiments, the corrosion-resistant material coating is fabricated by hard anodization or high-density anodization. The anodization layer is generally an aluminum oxidization layer, thereby preventing the delivered process gas and the plasma from corroding these components.

The inlet gas delivery component 1006 and the gas diffusion component 1007 is made of corrosion-resistant materials, for example, the gas diffusion component 1007 is alternatively made of a ceramic material such as aluminum oxide; the inlet gas delivery component 1006 is alternatively made of a ceramic material or vacuum smelted 316L stainless steel; the inlet gas channel 1061 in the inlet gas delivery component 1006 is washed by chemical corrosion so as to passivate the wall surface of the inlet gas channel 1061.

In some embodiments, the inlet gas delivery component 1006 and the gas diffusion component 1007 are both made of a ceramic material; all joints between every two of the liner body 1005, the inlet gas delivery component 1006, and the gas diffusion component 1007 are implemented by bonding, welding, or a fastener, etc. The inlet gas channel 1061, the gas diffusion channel 1071, and the outlet gas channel 1072 are joined into a hermetic gas passage made of a ceramic material, such that the process gas, after entering the gas passage in the liner body 1005, can only flow in the hermetic gas passage, without any contact with the liner body 1005 made of aluminum alloy, thereby thoroughly preventing metal contamination and solid particle contamination brought about by a corrosive fraction of the process gas in the passage.

As shown in FIG. 2 in conjunction with FIG. 3, a plurality of sealing structures are provided for the liner body 1005, the inlet gas delivery component 1006, and the gas diffusion component 1007, and a plurality of seals are respectively provided in the sealing structures so as to insulate from the process gas or insulate from the process gas and the atmospheric environment. In this embodiment, the sealing structures refer to seal grooves 1009. The seals refer to O-rings. A plurality of O rings are respectively disposed in the seal grooves 1009, wherein the O rings are corrosion resistant and made of air-tight fluororubber or fluorosilicone. The seal grooves 1009 are disposed at positions surrounding the process gas outlet ends and/or inlet ends or at positions surrounding the intersections between respective parts. In an illustrative embodiment, the seal grooves 1009 are disposed at the intersection between the liner body 1005 and the gas diffusion component 1007, the intersection between the gas diffusion component 1007 and the inlet gas delivery component 1006, the intersection between the inlet gas delivery component 1006 and the liner body 1005, and the intersection between the liner body 1005 and the dielectric window 1002.

The gas outlet holes 1052 are distributed uniformly in the internal sidewall of the liner body 1005, configured for homogeneous feed of the process gas; the length of the gas passage of the gas outlet holes 1052 is far shorter than the length of the outlet gas channels 1072, and the diameter of the gas outlet holes 1052 is greater than the diameter of the outlet gas channels 1072. A layer of physical sputtering deposited (PSD) or physical vapor deposited (PVD) corrosion-resistant material film is provided for the sidewall of the gas outlet holes 1052 and the surroundings thereof and for the internal surface of the gas diffusion component 1007 in contact with the liner body 1005. In some embodiments, the corrosion-resistant material film refers to an yttrium oxide film, configured for preventing plasma corrosion. The gas outlet holes 102 have a conical shape (i.e., the diameter of one end of the reaction chamber 1001 is greater than that of one end of the gas diffusion component 1007) or a straight shape with consistent diameters at two ends. Preferably, the gas outlet holes 1052 have a conical shape.

In addition, a layer of physical sputtering deposited (PSD) or physical vapor deposited (PVD) corrosion-resistant material coating is provided at a plurality of parts including the gas diffusion channels 1071, the inlet gas channel 1061, and the outlet gas channels 1072 so as to prevent the process gas delivered by the liner body 1005 from corroding these parts. In an illustrative example, a halogen corrosion-resistant material, such as Teflon, is coated at the parts such as the gas diffusion channel 1071; in this case, the parts including the gas diffusion channel 1071 are not corroded by the delivered gas fraction such as BCl3 and Cl2.

Embodiment II

Based on the structural characteristics of the inductively coupled plasma processing apparatus described in Embodiment 1, the current embodiment makes some alterations to the structure of the liner body 2005, mainly related to the internal sidewall of the liner body 2005 and the diffusion accommodation space 2054.

Figure 4:
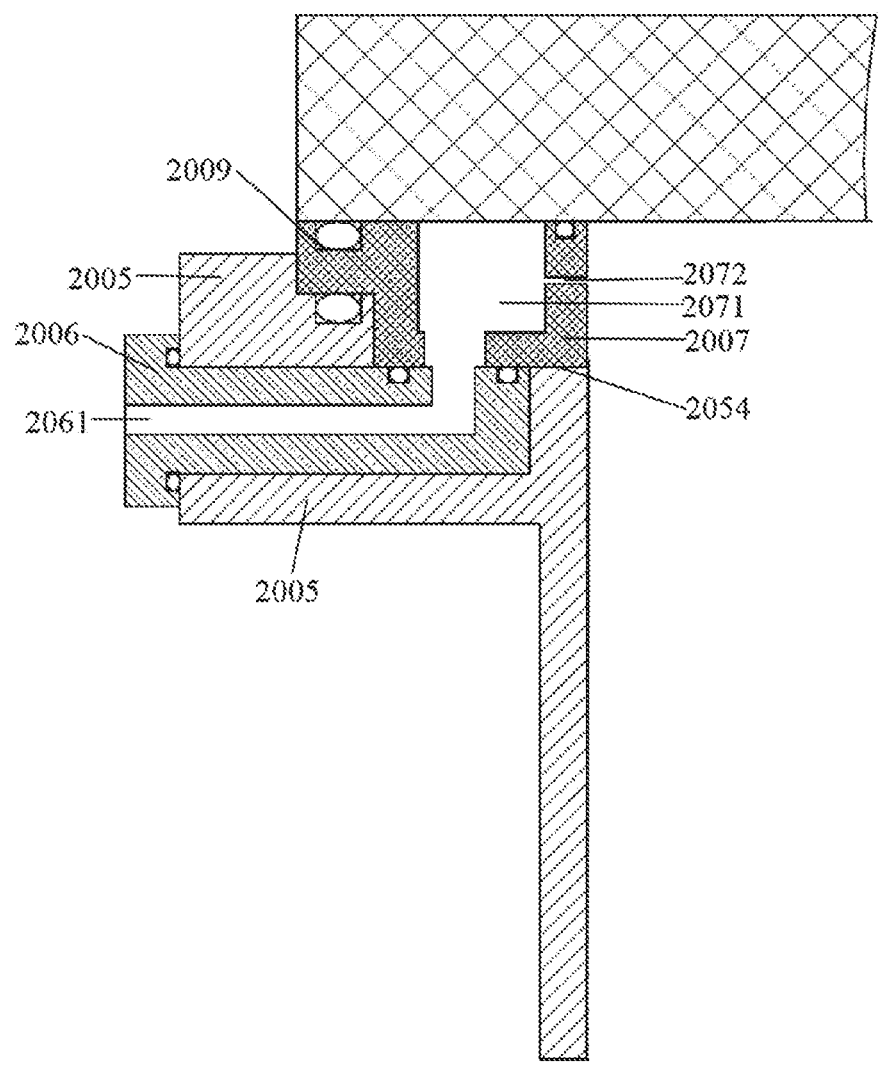
FIG. 4 is a structural schematic diagram of a gas delivery assembly in Embodiment II of the present disclosure.

FIG. 4 is a structural schematic diagram of a gas delivery assembly of the inductively coupled plasma processing apparatus according to Embodiment II. Compared with Embodiment I, the internal sidewall of the liner body 2005 is not provided with the gas outlet holes 1052; the diffusion accommodation space 2054 has a staged shape; the internal sidewall of the gas diffusion component 2007 in the diffusion accommodation space 2054 directly contacts with the chamber body environment of the reaction chamber 2001; the process gas is delivered, via the inlet gas channel 2061 of the inlet gas delivery component 2006, to the gas diffusion channel 2071 of the gas diffusion component 2007 from the gas tubing, and is then delivered into the reaction chamber via an outlet gas channel 2072 of the gas diffusion component 2007. The inductively coupled plasma processing apparatus in this embodiment significantly simplifies constructions of relevant parts and offers advantages such as a simple structure and convenient mounting; besides, relevant modules of the gas delivery assembly are easy to disassemble, and more convenient for daily use and maintenance.

In addition, the other components and the operations of thereof, such as the seal grooves 2009 and the O-rings, are all identical to their equivalents in Embodiment 1, which will not be detailed here.

Embodiment III

Based on the structural characteristics of the inductively coupled plasma processing apparatus described in Embodiment II, the current embodiment makes some alterations to the structure of the gas diffusion component 3007, mainly related to the gas diffusion channels 3071 in the gas diffusion component 3007.

Figure 5:
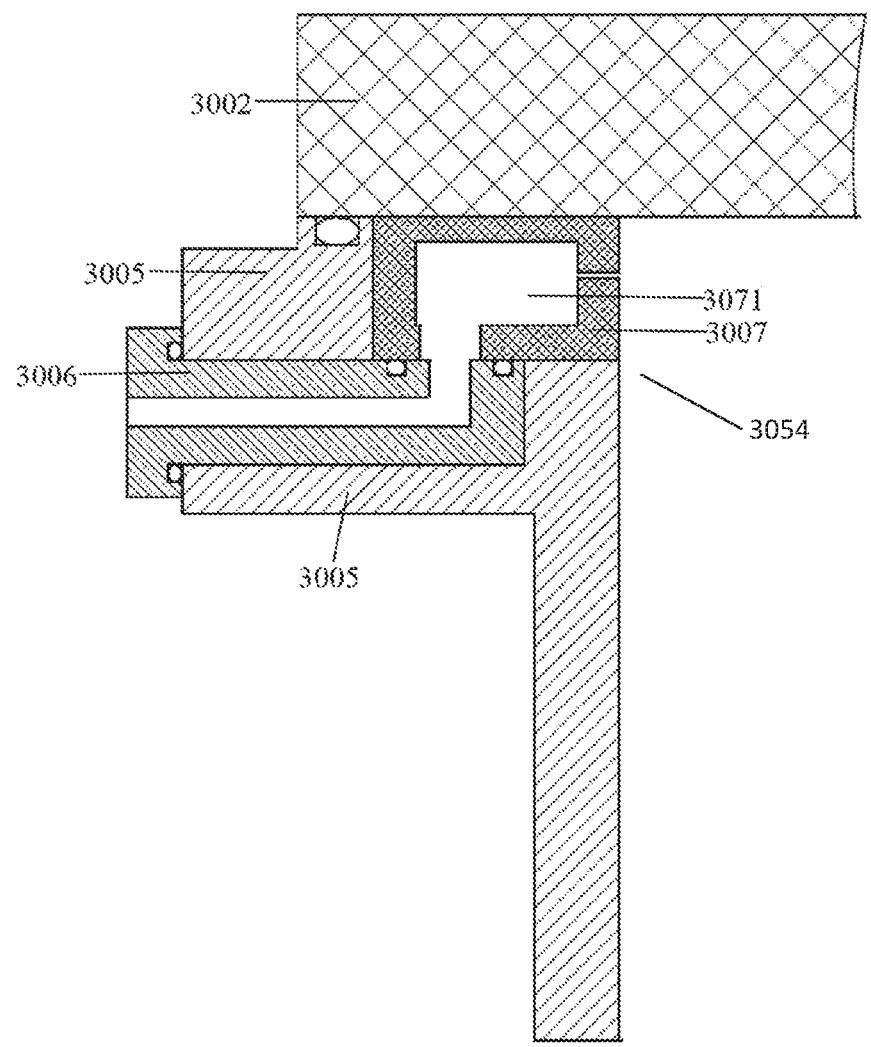
FIG. 5 is a structural schematic diagram of a gas delivery assembly in Embodiment III of the present disclosure.

FIG. 5 is a structural schematic diagram of a gas delivery assembly of the inductively coupled plasma processing apparatus according to Embodiment III. Compared with Embodiment II, the gas diffusion channels 3071 of the gas diffusion component 3007 in the current embodiment are enclosed gas channels, e.g., channels with an annular cross-section; the dielectric window 3002 contacts with the upper surface of the gas diffusion component 3007 rather than the gas diffusion channels 3071. The process gas delivery process of the apparatus is identical to Embodiment II. It is noted that the diffusion accommodation space 3054 in this embodiment is not limited to a staged shape, which may also be a recessed groove or other structure, as long as it matches with the gas diffusion component 3007.

The inductively coupled plasma processing apparatus in this embodiment prevents contact between the dielectric window 3002 and the process gas during gas delivery, such that the process gas is always confined in the gas passage constructed by the inlet gas delivery component 3006 and the gas diffusion component 3007, facilitating reduction of the odds of the dielectric window 3002 being corroded by a corrosive fraction in the process gas, which also avoids solid particle contaminations, reduces waste of materials, and facilitates routine maintenance.

In addition, the other components and the operations of thereof, such as the relationship between the inlet gas delivery component 3006 and the gas diffusion component 3007, as well as the relationship between the inlet gas delivery component 3006 and the liner body 3005, are all identical to the equivalents in Embodiment II, which will not be detailed here.

In view of the above, the present disclosure provides a corrosion-resistant gas delivery assembly and a plasma processing apparatus. An inlet gas delivery component 1006, a gas diffusion component 1007, and an inlet gas accommodation hole 1053 and a diffusion accommodation space 1054 that are arranged in a liner body 105, are combined, which avoids direct contact of the process gas with the liner body 1005 due to liner body surface defects caused by high temperature, effectively prevents corrosion of the process gas with respect to the gas delivery assembly and the plasma processing apparatus, and solves the problems such as metal contamination and solid particle contamination in the reaction chamber caused by a corrosive fraction in the process gas. Besides, the components where the gas diffusion channel 1071 and the inlet gas channel 1061 are provided respectively independent of the liner body 1005, such that only individual components are replaced when maintaining the gas delivery assembly, without replacing the whole structure of the liner body 1005, which reduces waste of material resources.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

We claim:

1. A corrosion-resistant gas delivery assembly in a plasma processing apparatus, comprising:
   a liner body circumferentially provided on a chamber body sidewall of the plasma processing apparatus and configured for accommodating an edge of a dielectric window, the liner body having
   a diffusion accommodation space circumferentially disposed in the liner body; and
   a gas diffusion component disposed in the diffusion accommodation space, wherein a material of the gas diffusion component is corrosion resistant, a gas diffusion channel is circumferentially provided in the gas diffusion component, and a plurality of outlet gas channels are further provided in an inner wall of the gas diffusion component, the outlet gas channels communicating with the gas diffusion channel.

2. The corrosion-resistant gas delivery assembly in the plasma processing apparatus according to claim 1, wherein the diffusion accommodation space is a recessed groove, and a plurality of gas outlet holes are provided in an internal sidewall of the liner body, the gas outlet holes communicating with the outlet gas channels.

3. The corrosion-resistant gas delivery assembly in the plasma processing apparatus according to claim 2, wherein a corrosion-resistant material coating is respectively provided for the inner wall of each of the gas outlet holes and for the surface of the gas diffusion component in contact with the internal side of the diffusion accommodation space.

4. The corrosion-resistant gas delivery assembly in the plasma processing apparatus according to claim 3, wherein the corrosion-resistant material coating comprises a Teflon coating or an yttrium oxide film or an anodized layer.

5. The corrosion-resistant gas delivery assembly in the plasma processing apparatus according to claim 2, wherein the gas outlet holes have a conical shape or a straight shape which has consistent diameters at two ends.

6. The corrosion-resistant gas delivery assembly in the plasma processing apparatus according to claim 1, wherein the diffusion accommodation space has a staged shape.

7. The corrosion-resistant gas delivery assembly in the plasma processing apparatus according to claim 1, wherein the gas diffusion channel is an open top gas diffusion channel or an enclosed gas channel.

8. The corrosion-resistant gas delivery assembly in the plasma processing apparatus according to claim 1, wherein an outer wall of the liner body is further provided with at least one inlet gas accommodation hole, the at least one inlet gas accommodation hole communicating with the diffusion accommodation space; and
    an inlet gas delivery component is provided in each of the at least one inlet gas accommodation hole, wherein a material of the inlet gas delivery component is corrosion resistant; an inlet gas channel is provided in the inlet gas delivery component, one end of the inlet gas channel communicating with a gas tubing of a gas delivery assembly, and the other end thereof communicating with the gas diffusion channel.

9. The corrosion-resistant gas delivery assembly in the plasma processing apparatus according to claim 8, wherein a material of the liner body includes: aluminum alloy; and a material of the inlet gas delivery component includes: ceramics or stainless steel; and a material of the gas diffusion component includes: ceramics.

10. The corrosion-resistant gas delivery assembly in the plasma processing apparatus according to claim 8, wherein a corrosion-resistant material coating is respectively provided for the diffusion accommodation space and a surface of the gas inlet accommodation hole; and
    a corrosion-resistant material coating is respectively provided for the inlet gas channel and/or the gas diffusion channel and/or the outlet gas channels.

11. The corrosion-resistant gas delivery assembly in the plasma processing apparatus according to claim 10, wherein the corrosion-resistant material coating refers to a Teflon coating or an yttrium oxide film or an anodized layer.

12. The corrosion-resistant gas delivery assembly in the plasma processing apparatus according to claim 1, wherein a plurality of sealing structures are provided among the liner body, the gas diffusion component, and the inlet gas delivery component; a plurality of seals are respectively disposed in the sealing structures; the sealing structures are disposed at the intersection between the liner body and the gas diffusion component, and/or at the intersection between the gas diffusion component and the inlet gas delivery component, and/or at the intersection between the inlet gas delivery component and the liner body.

13. The corrosion-resistant gas delivery assembly in the plasma processing apparatus according to claim 1, wherein
    the gas outlet holes have a larger diameter at the exit end than at the inlet end.

14. A plasma processing apparatus including a corrosion-resistant gas delivery assembly, comprising:
    a reaction chamber;
    a corrosion-resistant gas delivery assembly comprising a liner body which is circumferentially provided on a chamber body sidewall of the reaction chamber, the liner body having a diffusion accommodation space circumferentially disposed in the liner body; and
    a gas diffusion component disposed in the diffusion accommodation space, wherein a material of the gas diffusion component is corrosion resistant, a gas diffusion channel is circumferentially provided in the gas diffusion component, and a plurality of outlet gas channels are further provided in an inner wall of the gas diffusion component, the outlet gas channels communicating with the gas diffusion channel; and
    a dielectric window disposed on the liner body.

15. The plasma processing apparatus according to claim 14, further comprising:
    an inductively coupled coil disposed on the dielectric window, wherein the inductively coupled coil is loaded with a radio-frequency power, the radio-frequency power being coupled into the reaction chamber via the dielectric window; and the process gas fed into in the reaction chamber via a gas delivery assembly is ionized into plasma, the plasma being configured to process a wafer disposed at the bottom of the reaction chamber.

* * * * *